United States Patent
Kim et al.

(10) Patent No.: US 9,183,946 B2
(45) Date of Patent: Nov. 10, 2015

(54) METHOD OF STORING DATA IN NONVOLATILE MEMORY DEVICE AND METHOD OF TESTING NONVOLATILE MEMORY DEVICE

(71) Applicants: Eun-Kyoung Kim, Hwaseong-Si (KR); Myoung-Won Yoon, Suwon-Si (KR); Jong-Chul Lee, Hwaseong-Si (KR); Oh-Suk Kwong, Seoul (KR); Won-Chul Lee, Yongin-Si (KR)

(72) Inventors: Eun-Kyoung Kim, Hwaseong-Si (KR); Myoung-Won Yoon, Suwon-Si (KR); Jong-Chul Lee, Hwaseong-Si (KR); Oh-Suk Kwong, Seoul (KR); Won-Chul Lee, Yongin-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 5 days.

(21) Appl. No.: 14/153,140

(22) Filed: Jan. 13, 2014

(65) Prior Publication Data

US 2014/0198581 A1    Jul. 17, 2014

(30) Foreign Application Priority Data

Jan. 14, 2013    (KR) ........................ 10-2013-0003782

(51) Int. Cl.
*G11C 16/06*    (2006.01)
*G11C 16/34*    (2006.01)
*G11C 29/08*    (2006.01)
*G11C 29/50*    (2006.01)

(52) U.S. Cl.
CPC .......... *G11C 16/3459* (2013.01); *G11C 16/349* (2013.01); *G11C 16/3418* (2013.01); *G11C 29/08* (2013.01); *G11C 29/50016* (2013.01)

(58) Field of Classification Search
CPC .......... G11C 16/3454; G11C 16/3459; G11C 11/5628; G11C 16/0483; G11C 2211/5621; G11C 16/344; G11C 2216/14; G11C 16/349; G11C 2211/5623; G11C 2211/5624
See application file for complete search history.

(56) References Cited

U.S. PATENT DOCUMENTS

| | | | |
|---|---|---|---|
| 7,173,862 B2 | 2/2007 | Futatsuyama et al. | |
| 7,423,904 B2 | 9/2008 | Kojima | |
| 7,474,565 B2 | 1/2009 | Huang et al. | |
| 7,881,115 B2 | 2/2011 | Kim et al. | |
| 2009/0290418 A1* | 11/2009 | Han | 365/185.09 |
| 2010/0002514 A1 | 1/2010 | Lutze et al. | |

FOREIGN PATENT DOCUMENTS

| | | |
|---|---|---|
| KR | 1020070109684 A | 11/2007 |
| KR | 1020070111663 A | 11/2007 |
| KR | 1020080090801 A | 10/2008 |

* cited by examiner

*Primary Examiner* — Thong Q Le
(74) *Attorney, Agent, or Firm* — Volentine & Whitt, PLLC

(57) ABSTRACT

A method of storing data in a nonvolatile memory device comprises performing a program operation on target memory cells among multiple memory cells, performing a first verify operation to determine whether the target memory cells are in a program pass state or a program fail state, and as a consequence of determining that the target memory cells are in the program pass state, performing a second verify operation to determine whether the target memory cells exhibit a program error symptom.

18 Claims, 19 Drawing Sheets

METHOD OF STORING DATA IN NONVOLATILE MEMORY DEVICE AND METHOD OF TESTING NONVOLATILE MEMORY DEVICE

CROSS-REFERENCE TO RELATED APPLICATION

This application claims priority under 35 USC §119 to Korean Patent Application No. 2013-0003782 filed on Jan. 14, 2013, the subject matter of which is hereby incorporated by reference.

BACKGROUND OF THE INVENTION

The inventive concept relates generally to electronic memory technologies. More particularly, certain embodiments of the inventive concept relate to methods for storing data in a nonvolatile memory device and methods for testing a nonvolatile memory device.

Most nonvolatile memory devices are subject to deterioration according to their usage. For example, flash memory devices tend to fail after a certain number of program or erase operations have been performed.

To cope with deterioration of individual memory cells, many nonvolatile memory devices or controllers include error correction circuitry that can overcome failures in a small number of memory cells. However, if the number of errors becomes relatively large, it may exceed the capability of the error correction circuitry and data may be lost.

To avoid losing data due to large numbers of errors, some nonvolatile memory devices keep track of failed memory cells, and take measures to protect data if the number of failed memory cells approaches a critical level. Unfortunately, such measures may be inadequate in the event that the failures follow an irregular pattern, e.g., where numerous memory cells become failed memory cells at approximately the same time.

SUMMARY OF THE INVENTION

In one embodiment of the inventive concept, a method of storing data in a nonvolatile memory device comprises performing a program operation on target memory cells among multiple memory cells, performing a first verify operation to determine whether the target memory cells are in a program pass state or a program fail state, and as a consequence of determining that the target memory cells are in the program pass state, performing a second verify operation to determine whether the target memory cells exhibit a program error symptom.

In another embodiment of the inventive concept, a method of testing a nonvolatile memory device comprises performing a program operation on target memory cells among multiple memory cells based on a test command provided from an external tester, performing a first verify operation to determine whether the target memory cells are in a program pass state or a program fail state, as a consequence of the first verify operation determining that the target memory cells are in the program pass state, performing a second verify operation to determine whether the target memory cells exhibit a program error symptom, and selectively performing a repair operation on the target memory cells according to results of the first and second verify operations.

These and other embodiments of the inventive concept can potentially improve the reliability of nonvolatile memory devices by taking preventative measures to avoid future data loss.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In the description that follows, although the terms first, second, etc., may be used to describe various features, the described features should not be limited by these terms. Rather, these terms are used merely to distinguish one feature from another. For example, a first feature could be termed a second feature, and, similarly, a second feature could be termed a first feature, without materially altering the meaning of the text. As used herein, the term "and/or" includes any and all combinations of one or more of the associated listed items.

Where a feature is referred to as being "connected" or "coupled" to another feature, it can be directly connected or coupled to the other feature or intervening features may be present. In contrast, where a feature is referred to as being "directly connected" or "directly coupled" to another feature, there are no intervening features present. Other words used to describe the relationship between features should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," where used herein, specify the presence of stated features but do not preclude the presence or addition of other features.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and will not be interpreted in an idealized or overly formal sense unless expressly so defined herein.

Figure 1:
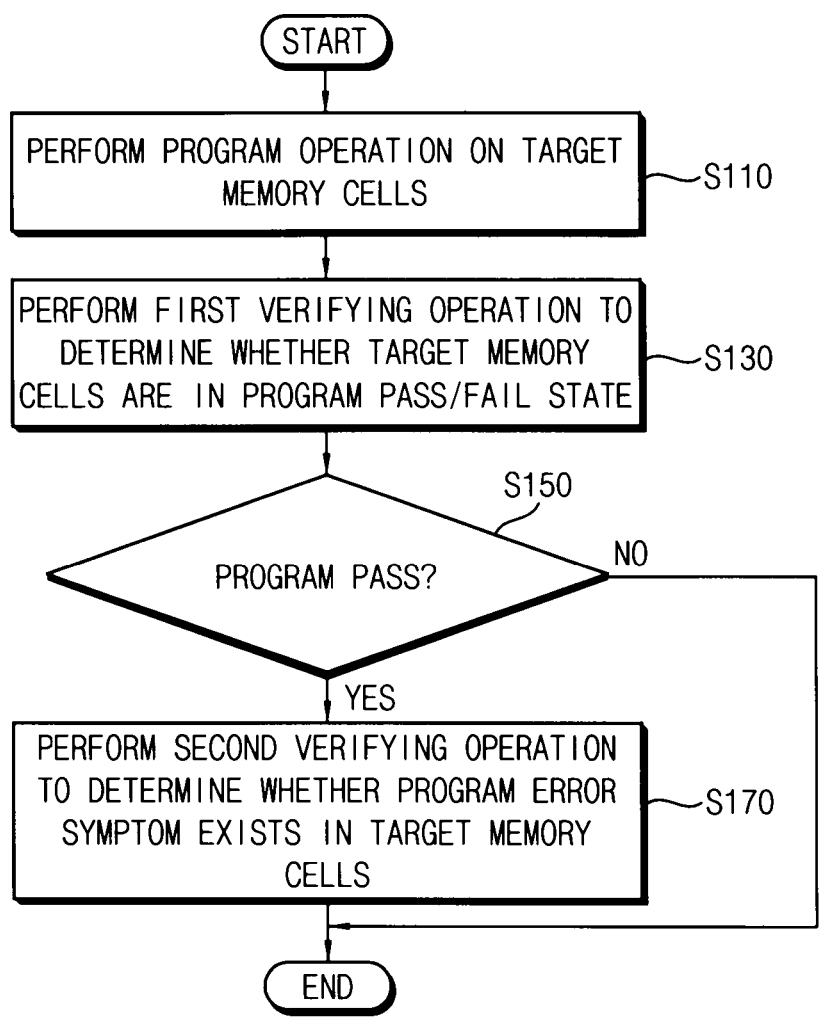
FIG. 1 is a flowchart illustrating a method of storing data in a nonvolatile memory device according to an embodiment of the inventive concept.

FIG. 1 is a flowchart illustrating a method of storing data in a nonvolatile memory device, according to an embodiment of the inventive concept. The method of FIG. 1 may be utilized in a nonvolatile memory device that performs a write operation by applying a substantially constant program voltage to selected memory cells to change their threshold voltages. Although certain embodiments are described with reference to a flash memory device, the inventive concept can be applied more generally to any type of nonvolatile memory device, with selected examples including a phase change random access memory (PRAM), a resistance random access memory (RRAM), an magnetic random access memory (MRAM), or a ferroelectric random access memory (FRAM). Hereinafter, detailed configurations of a flash memory device and a memory cell array in the flash memory device will be described with reference to FIGS. 2, 3A, 3B, 3C and 9.

Referring to FIG. 1, the method performs a program operation for target memory cells among multiple memory cells (S110). Thereafter, a first verify operation is performed to determine whether the target memory cells are in a program pass state or a program fail state (S130). The program pass state indicates that the target memory cells have been successfully programmed to a desired threshold voltage, and the program fail state indicates that the target memory cells have not been successfully programmed to the desired threshold voltage. The target memory cells are typically programmed by applying a program voltage to a word line of the target memory cells, and a verification operation is typically performed by applying a verification voltage to the word line of the target memory cells and determining whether the target memory cells turn on in response to the applied verification voltage.

Next, the method determines whether the first verification operation determined that the program pass state was reached (S150). If not (S150=NO), the method terminates. Otherwise (S150=YES), a second verify operation is performed to determine whether the target memory cells have a program error symptom. The detection of the program error symptom, examples of which will be described in further detail below, can be used to prevent uncorrectable errors from arising subsequently in stored data.

Figure 2:
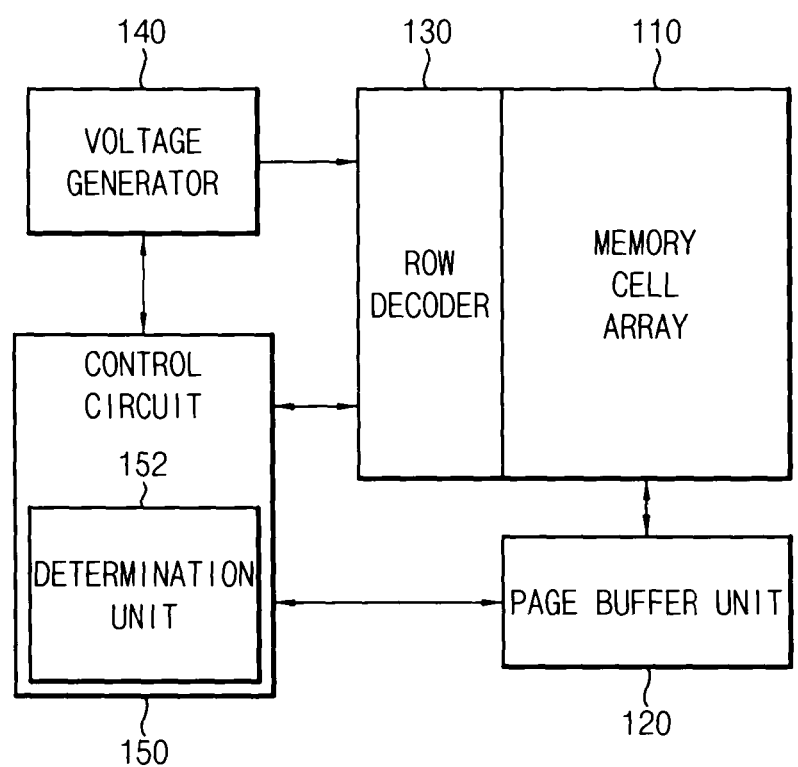
FIG. 2 is a block diagram of a nonvolatile memory device configured to perform a data storing method according to an embodiment of the inventive concept.

FIG. 2 is a block diagram of a nonvolatile memory device 100 configured to perform a data storing method, according to an embodiment of the inventive concept. Nonvolatile memory device 100 may be, for instance, a flash memory device.

Referring to FIG. 2, nonvolatile memory device 100 comprises a memory cell array 110, a page buffer unit 120, a row decoder 130, a voltage generator 140, and a control circuit 150.

Memory cell array 110 comprises multiple memory cells connected to multiple word lines and multiple bit lines, respectively. As described below with reference to FIGS. 3A to 3C, the memory cells may be NAND or NOR flash memory cells and may be arranged in a two or three dimensional array structure.

In some embodiments, the memory cells may be single level cells (SLCs) or multi-level cells (MLCs). In embodiments including MLCs, a program scheme in a write mode may be, for instance, a shadow program scheme, a reprogrammable scheme, or an on-chip buffered program scheme.

Page buffer unit 120 is connected to the bit lines and stores write data programmed in memory cell array 110 or read data sensed from memory cell array 110. In other words, page buffer unit 120 may be operated as a write driver or a sensing amplifier according to an operation mode of flash memory device 100. For example, page buffer unit 120 may be operated as the write driver in the write mode and as the sensing amplifier in the read mode.

Row decoder 130 is connected to the word lines and selects at least one of the word lines in response to a row address. Voltage generator 140 generates word line voltages such as a program voltage, a pass voltage, a verification voltage, an erase voltage and a read voltage according to a control of control circuit 150. Control circuit 150 controls page buffer unit 120, row decoder 130 and voltage generator 140 to perform program, erase, and read operations on memory cell array 110.

Control circuit 150 comprises a determination unit 152. Determination unit 152 performs the second verify operation to determine whether the program error symptom exists in the target memory cells. An example configuration and operation of determination unit 152 will be described with respect to FIGS. 4A, 4B, 6, 7A, 7B and 8.

In some embodiments of the inventive concept, all or part of determination unit 152 may be implemented as hardware or software which is executable by a processor such as a microprocessor or a central processing unit (CPU). Further, in some embodiments, determination unit 152 may be disposed at an arbitrary position in flash memory device 100 or at an outside of flash memory device 100 such as a memory controller (not shown).

Figure 3A:
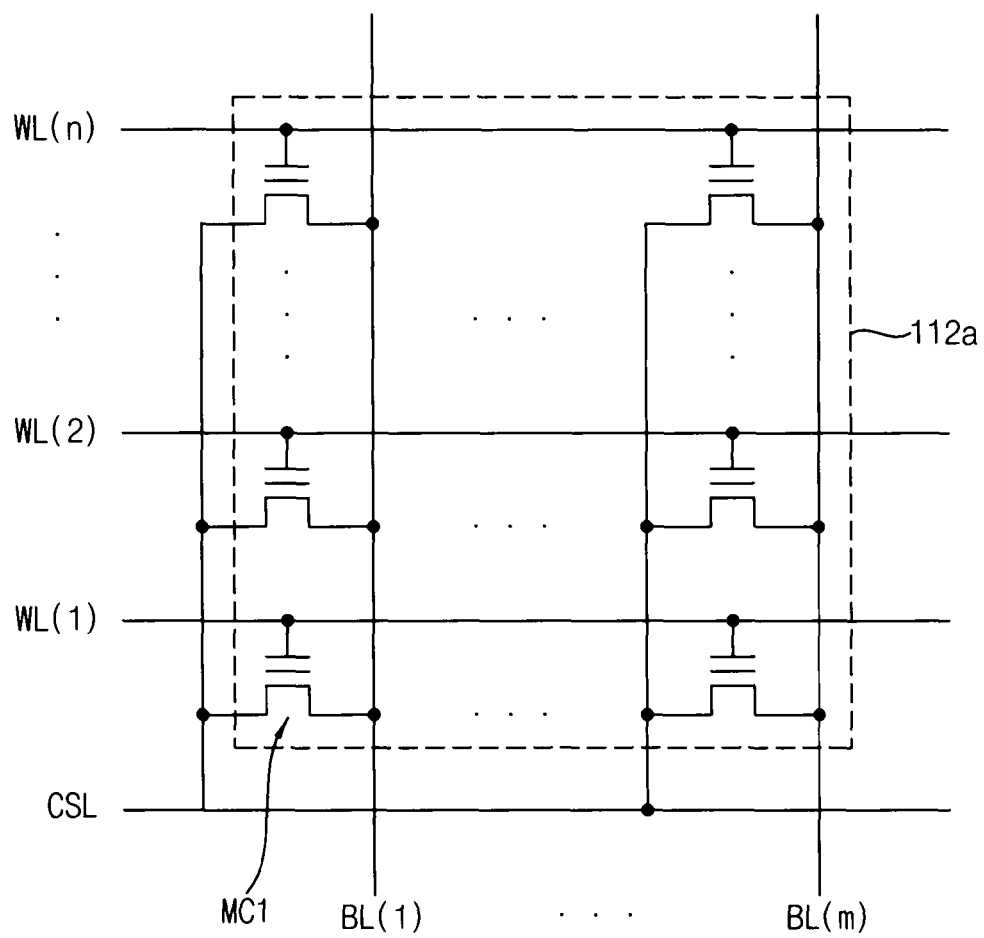
FIG. 3A is a circuit diagram of a memory cell array in the nonvolatile memory device of FIG. 2, according to an embodiment of the inventive concept.
Figure 3B:
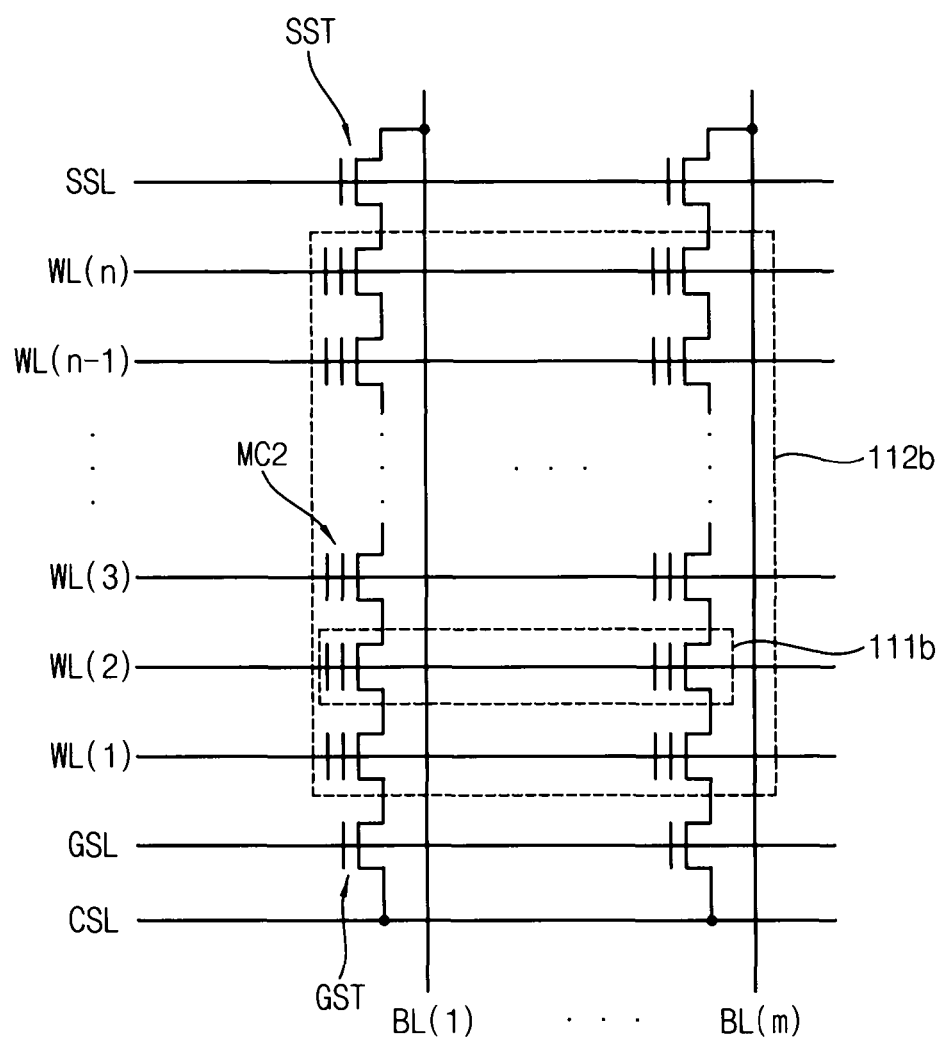
FIG. 3B is a circuit diagram of a memory cell array in the nonvolatile memory device of FIG. 2, according to another embodiment of the inventive concept.
Figure 3C:
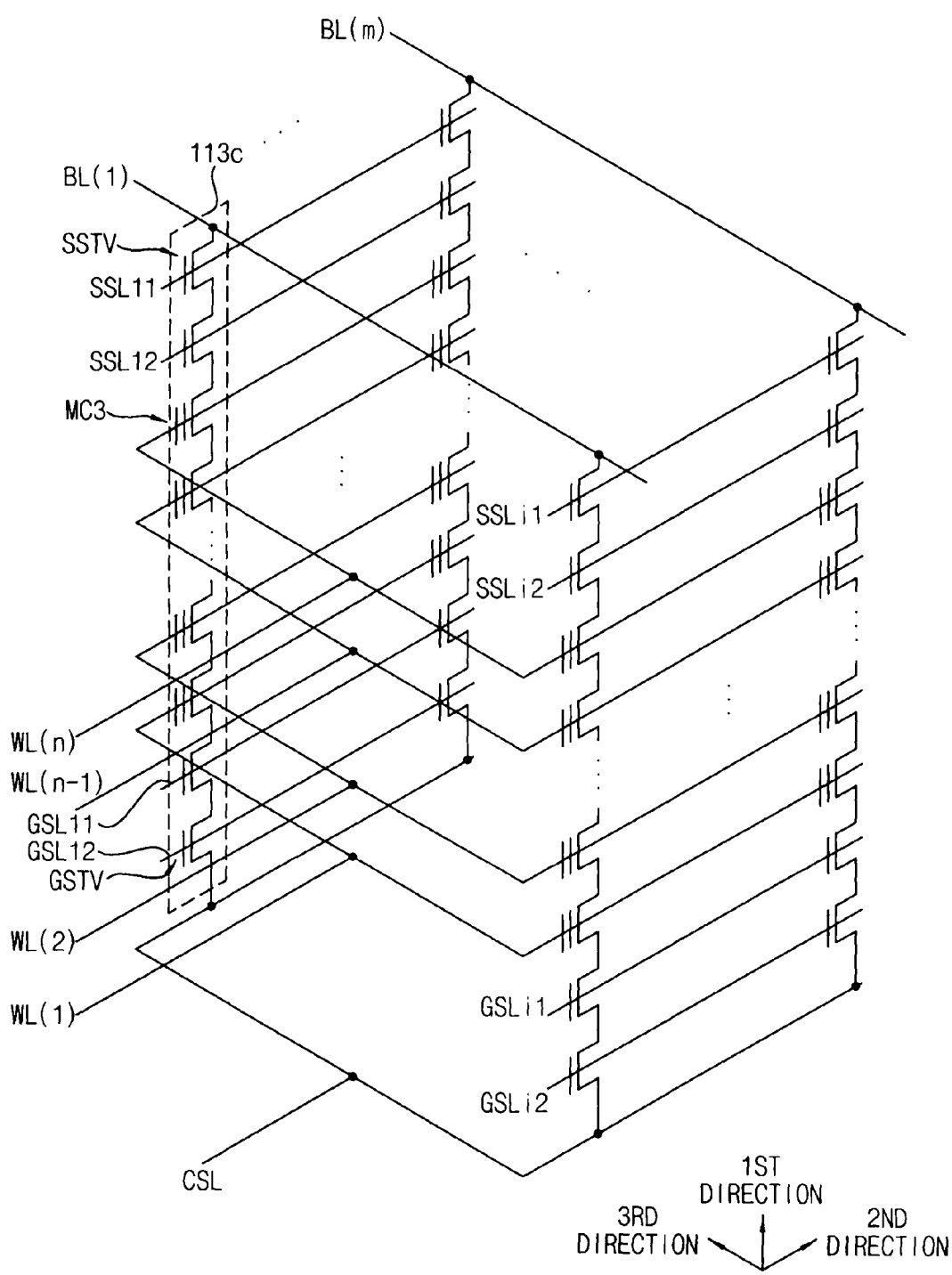
FIG. 3C is a circuit diagram of a memory cell array in the nonvolatile memory device of FIG. 2, according to another embodiment of the inventive concept.

FIGS. 3A, 3B and 3C are circuit diagrams showing examples of a memory cell array in the nonvolatile memory device of FIG. 2, according to embodiments of the inventive concept. More particularly, FIG. 3A is a circuit diagram of one example of a memory cell array in a NOR flash memory device, FIG. 3B is a circuit diagram of one example of a memory cell array in a NAND flash memory device, and FIG. 3C is a circuit diagram of one example of a memory cell array in a vertical flash memory device.

Referring to FIG. 3A, memory cell array 110a may include multiple memory cells MC1. Memory cells MC1 located in the same row may be disposed in parallel between one of bit lines BL(1), . . . , BL(m) and a common source line CSL and may be connected in common to one of word lines WL(1), WL(2), . . . , WL(n)). For example, memory cells located in the first row may be disposed in parallel between the first bit line WL(1) and common source line CSL. The gate electrodes of the memory cells disposed in the first row may be connected in common to first word line WL(1). Memory cells MC1 may be controlled according to a level of a voltage applied to word lines WL(1), . . . , WL(n). The NOR flash memory device comprising memory cell array 110a may perform the write and read operations in units of byte or words and may perform the erase operation in units of block.

Referring to FIG. 3B, memory cell array 110b comprises string selection transistors SST, ground selection transistors GST and memory cells MC2. String selection transistors SST are connected to bit lines BL(1), . . . , BL(m), and ground selection transistors GST are connected to common source line CSL. Memory cells MC2 disposed in the same row are disposed in series between one of bit lines BL(1), . . . , BL(m) and common source line CSL, and memory cells MCs disposed in the same column are connected in common to one of word lines WL(1), WL(2), WL(3), . . . , WL(n-1), WL(n). That is memory cells MC2 are connected in series between string selection transistors SST and ground selection transistors GST, and the word lines of 16, 32, or 64 are disposed between string selection line SSL and ground selection line GSL.

String selection transistors SST are connected to string selection line SSL such that string selection transistors SST may be controlled according to a level of the voltage applied from string selection line SSL thereto. Memory cells MC2 may be controlled according to a level of a voltage applied to word lines WL(1), . . . , WL(n).

The NAND flash memory device comprising memory cell array 110b performs write and read operations in units of page 111b, and it performs erase operations in units of block 112b. Meanwhile, according to some embodiments, each of the page buffers may be connected to even and odd bit lines one by one. In this case, the even bit lines form an even page, the odd bit lines form an odd page, and the even and odd pages may perform by turns and sequentially the write operation into memory cells MC2.

Referring to FIG. 3C, memory cell array 110c comprises multiple strings 113c having a vertical structure. Strings 113c are formed in the second direction to form a string row. Multiple string rows are formed in the third row to form a string array. Each of strings 113c comprises ground selection transistors GSTV, memory cells MC3, and string selection transistors SSTV, which are disposed in series in the first direction between bit lines BL(1), . . . , BL(m) and common source line CSL.

Ground selection transistors GSTV are connected to ground selection lines GSL11, GSL12, . . . , GSLi1, GSLi2, respectively, and string selection transistors SSTV are connected to string selection lines SSL11, SSL12, . . . , SSLi1, SSLi2, respectively. Memory cells MC3 disposed the same layer are connected in common to one of word lines WL(1), WL(2), . . . , WL(n-1), WL(n). Ground selection lines GSL11, . . . , GSLi2 and string selection lines SSL11, . . . , SSLi2 extend in the second direction and are formed along the third direction. Word lines WL(1), . . . , WL(n) extend in the second direction and are formed along the first and third directions. Bit lines BL(1), . . . , BL(m) extend in the third direction and are formed along the second direction. Memory cells MC3 are controlled according to a level of a voltage applied to word lines WL(1), . . . , WL(n).

Because the vertical flash memory device comprising memory cell array 110c comprises NAND flash memory cells, like the NAND flash memory device, the vertical flash memory device performs the write and read operations in units of pages and the erase operation in units of block.

In some embodiments, two string selection transistors in one string 113c are connected to one string selection line and two ground selection transistors in one string are connected to one ground selection line. Further, according to some embodiments, one string comprises one string selection transistor and one ground selection transistor.

Figure 4A:
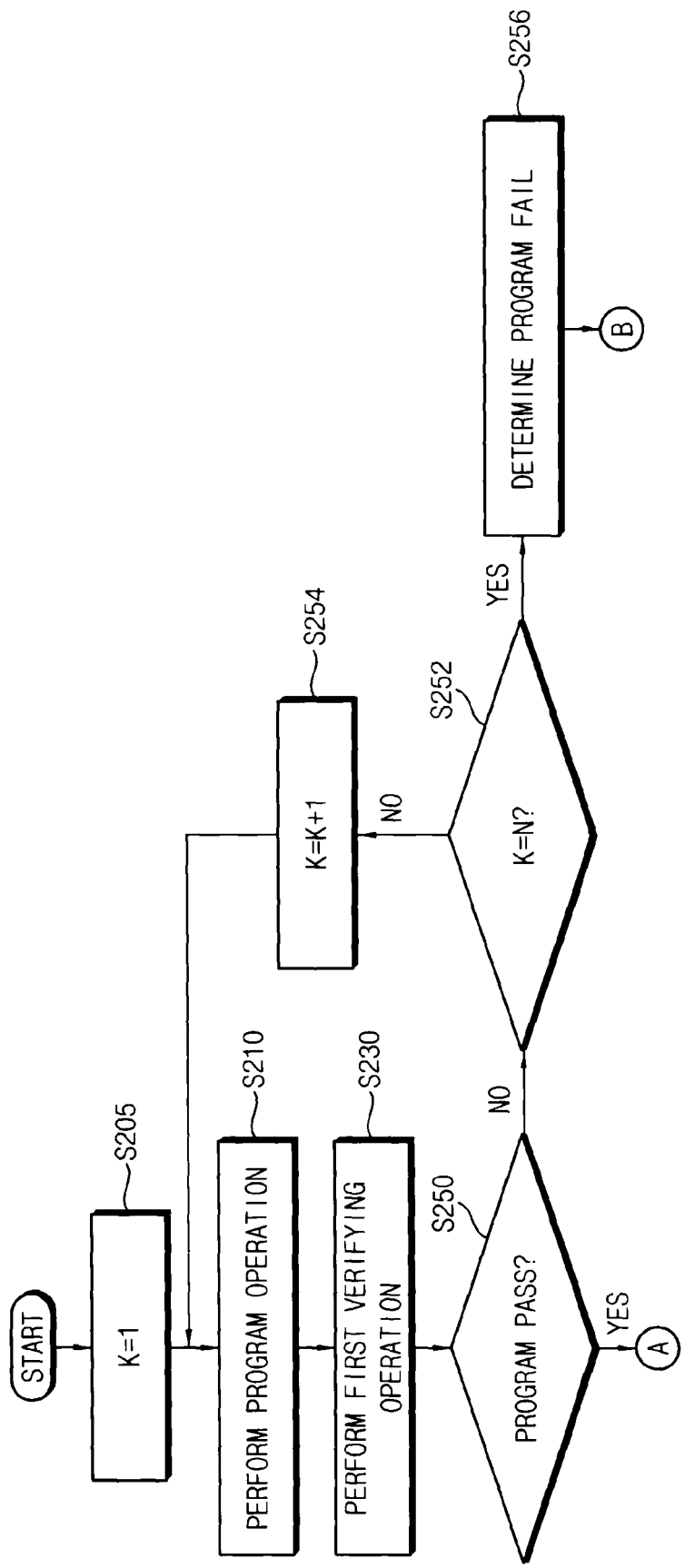
FIG. 4A is a flowchart illustrating a method of storing data in a nonvolatile memory device of FIG. 1, according to an embodiment of the inventive concept.
Figure 4B:
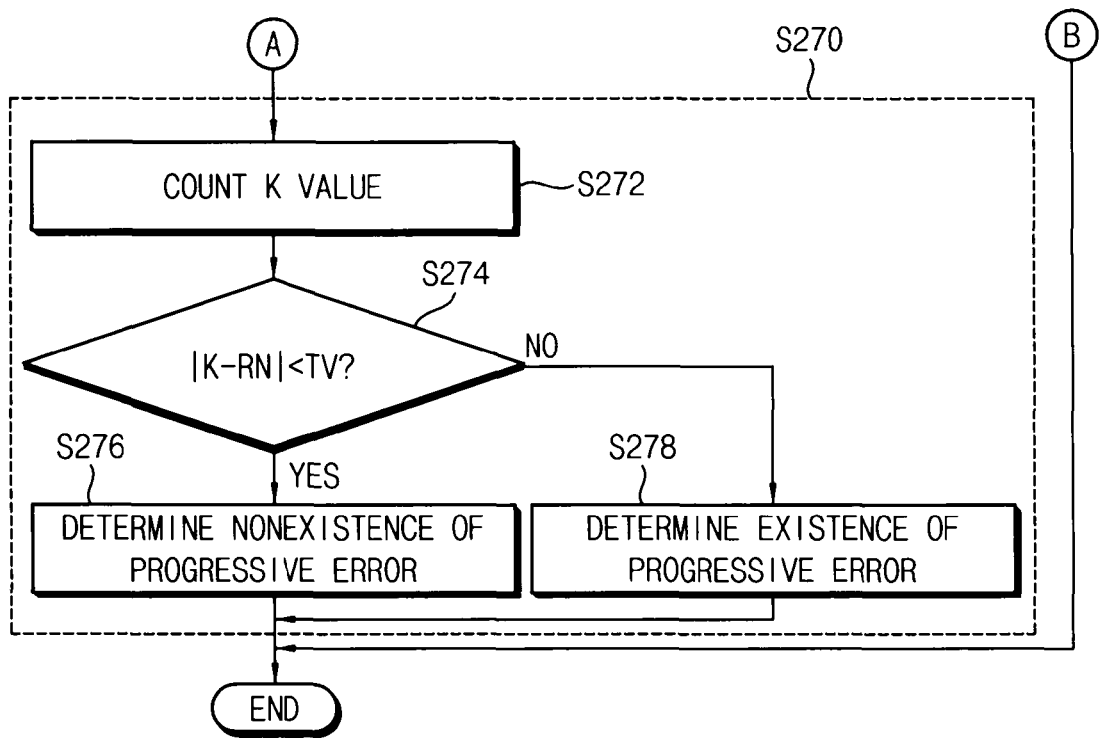
FIG. 4B is a flowchart illustrating a method of storing data in a nonvolatile memory device of FIG. 1, according to an embodiment of the inventive concept.

FIGS. 4A and 4B are flowcharts illustrating a method of storing data in a nonvolatile memory device of FIG. 1, according to an embodiment of the inventive concept.

Referring to FIGS. 4A and 4B, the method resets the number K of program loops (S205). One program loop is formed by one program operation and one first verify operation, and the number K of program loops represents a number of iterations repeating the program operation and the first verify operation. For example, the number K of program loops may be reset into "1".

Next, the program operation for the target memory cells is performed by applying a program voltage to the word line of the target memory cells (S210). A program allowing voltage is applied to the bit line of the target memory cells. A pass voltage is applied to word lines not connected to the target memory cells, and a program prohibiting voltage is applied to bit lines not connected to the target memory cells. As described above with reference to FIG. 3B, where the nonvolatile device is a NAND flash memory device, the target memory cells may include at least one page (111b of FIG. 3B).

Next, the first verify operation is performed by applying a verifying voltage to the word line of the target memory cells and by comparing the verifying voltage with the threshold voltage of the target memory cells (S230).

The program loop is selectively repeated based on the result of the first verify operation. For example, where it is determined based on the result of the first verify operation that the target memory cells are in the program fail (S250=NO), the program loop including the program and the first verify operations is repeatedly performed. Where it is determined based on the result of the first verify operation that the target memory cells are in the program pass (S250=YES), an additional program loop is not performed, and the second verify operation is performed.

Where it is determined that the target memory cells are in the program fail state (S250=NO), the method determines whether the number K of program loops is equal to a maximum number N (S252). If so (S252=YES) the method determines that a program failure has occurred (S256), and the method terminates as illustrated in FIG. 4B. Otherwise (S252=NO), K is incremented (S254) and the method returns to operation S210 to perform another program loop.

In some embodiments, the program loops are performed with an incrementally increasing program voltage—a technique referred to as incremental step pulse programming (ISPP). In this technique, the verifying voltage may also be varied between different program loops.

Where it is determined that the target memory cells are in the program pass (S250=YES) so that the second verify operation is performed (S270), the number K of program loops is counted (S272) and it is determined by comparing the number K of program loops with reference number RN whether a progressive error occurs in the target memory cells. For example, where a difference between the number K of program loops and reference number RN is less than a target value TV (S274=YES), it may be determined that the progressive error occurs in the target memory cells, so that the storing of the data may be successfully completed. As used herein, the term "progressive error" denotes a state of memory cells in which they have progressed to a certain stage toward becoming failed memory cells, as indicated by, e.g., the number of program loops or the amount of time required to achieve successful programming Where the difference between the number K of program loops and reference number RN is equal to and greater than target value TV (S274=NO), it may be determined in operation S278 that the progressive error occurs in the target memory cells. As described below with reference to FIGS. 12A and 12B, even though it is determined that the target memory cells, which are determined to have a progressive error, are in the program pass state, the target memory cells may be replaced with any other memory cells of the memory cells.

Figure 5:
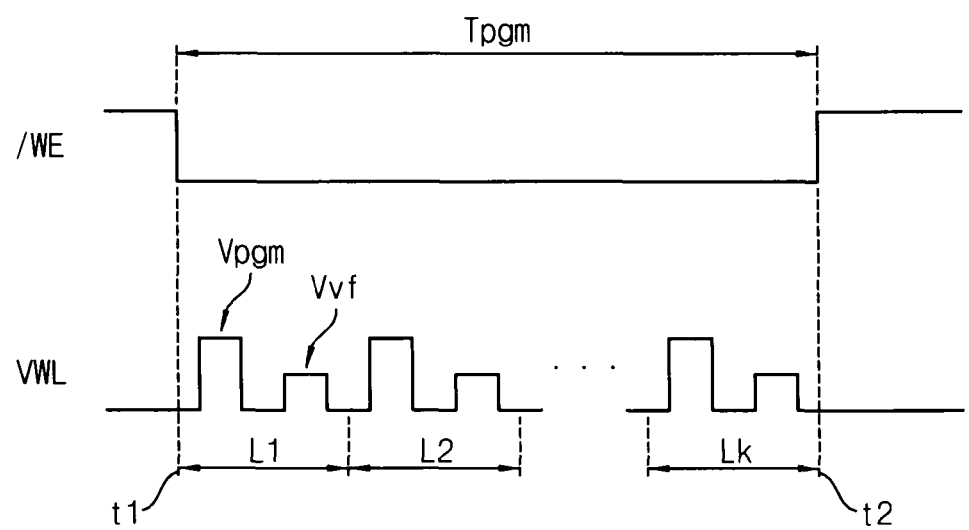
FIG. 5 is a timing diagram illustrating a method of storing data in a nonvolatile memory device, according to an embodiment of the inventive concept.

FIG. 5 is a timing diagram illustrating a method of storing data in a nonvolatile memory device, according to an embodiment of the inventive concept.

Referring to FIG. 5, a write enable signal is activated at time t1 so that the storing of data is initiated. Program voltage Vpgm is applied to the word line of the target memory cells so that the program operation is performed, and after the program operation is performed, verifying voltage Vvf is applied to the word line of the target line of the target memory cells so that the first verify operation is performed. As program loops L1, L2, ..., LK, the program and verifying voltages Vpgm and Vvf are repeatedly applied to the word line of the target memory cells, so that a voltage VWL of the word line of the target memory cells may have a waveform as shown in FIG. 5. After the program loop is repeated K times, if it is determined that the target memory cells are in the program pass state, the program loop is no longer repeated and the write enable signal/WE is inactivated at time t2. An interval from time t1 to t2 corresponds to the program lapse time Tpgm.

According to some embodiments, as described above with reference to FIGS. 4A and 4B, determination unit 152 performs the second verify operation for the target memory cells based on the number K of program loops and reference number RN after time t2. According to some embodiments, as described above with reference to FIGS. 7A and 7B, determination unit 152 performs the second verify operation for the target memory cells based on the program lapse time Tpgm and reference time RT RN after time t2.

Figure 6:
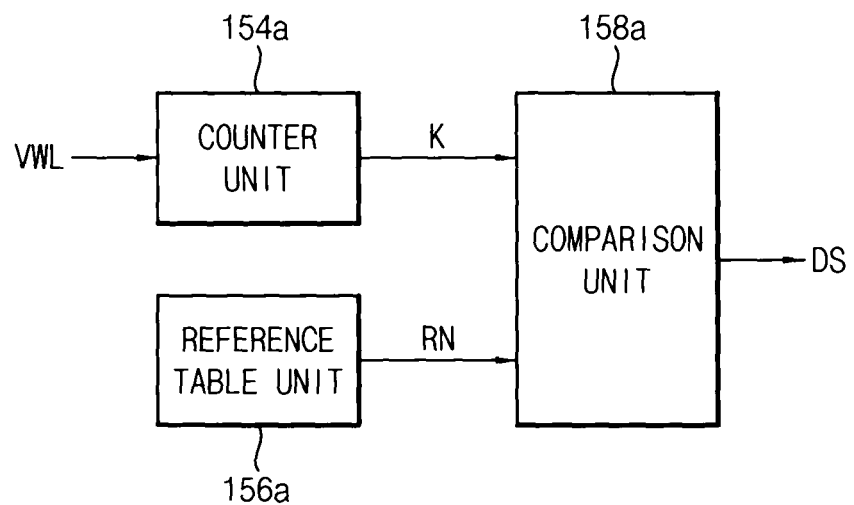
FIG. 6 is a block diagram of a determination unit in the nonvolatile memory device of FIG. 2, according to an embodiment of the inventive concept.

FIG. 6 is a block diagram of the determination unit in the nonvolatile memory device in FIG. 2, according to an embodiment of the inventive concept.

Referring to FIGS. 2 and 6, determination unit 152a comprises a counter unit 154a, a reference table unit 156a and a comparison unit 158a.

Counter unit 154a counts the number K of program loops. For example, counter 154a may count the number K of program loops by counting the number of pulses of program voltage Vpgm in the word line voltage VWL of the target memory cells. In this case, nonvolatile memory device 100 may further receive a separate loop-out command for counting the number of pulses of program voltage Vpgm.

Reference table unit 156a stores reference number RN therein and outputs reference number RN. Reference table unit 156a may be an arbitrary storage device such as a volatile memory or a nonvolatile memory and reference number RN may be stored in a form of a look-up table.

According to some embodiments, memory cell array 110 of memory device 100 comprises at least two memory blocks including a part of memory cells, and reference number RN corresponds to an average number of the program loops for the first memory block including the target memory cells among the memory blocks. For example, where nonvolatile memory device 100 is a NAND flash memory device, the target memory cells may be in at least one page (111b of FIG. 3B: that is, performance of the write operation by units of page), and reference number RN may correspond to the average value of the numbers of program loops of all pages in the block (112b of FIG. 3B). According to some embodiments, reference number RN may correspond to an arbitrary value predetermined according to a threshold voltage distribution of the memory cells.

Comparison unit 158a compares the number K of program loops with reference number RN to determine whether a progressive error is present in the target memory cells. For example, comparison unit 158a may compare the difference of the number K of program loops and reference number RN with target value TV to generate a detection signal DS corresponding to the determination result. Detection signal DS may have a first logic level where the progressive error does not occur in the target memory cells and may have a second logic level where the progressive error occurs in the target memory cells.

As described above, a part or all of counter unit 154a, reference table unit 156a and comparison unit 158a may be implemented in hardware or software.

Figure 7A:
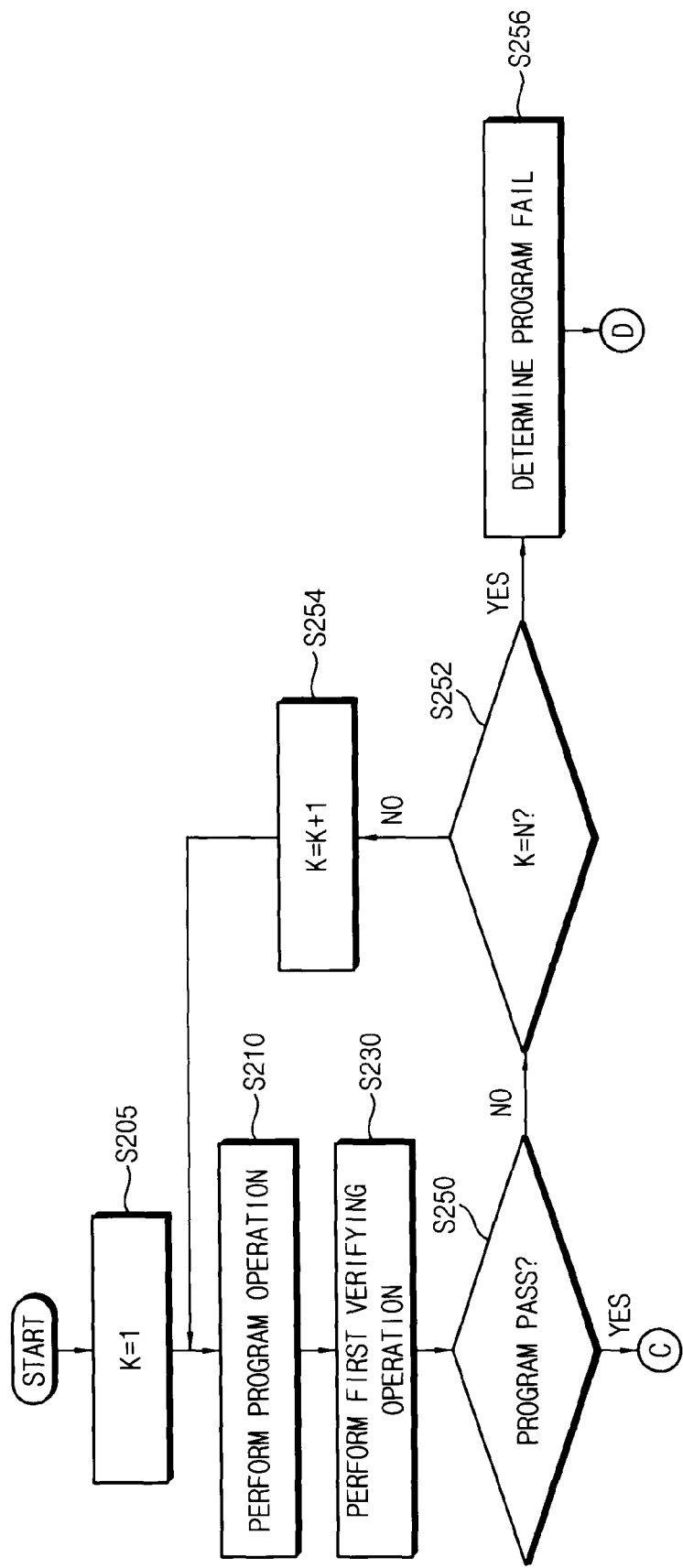
FIG. 7A is a flowchart illustrating a method of storing data in a nonvolatile memory device of FIG. 1, according to another embodiment of the inventive concept.
Figure 7B:
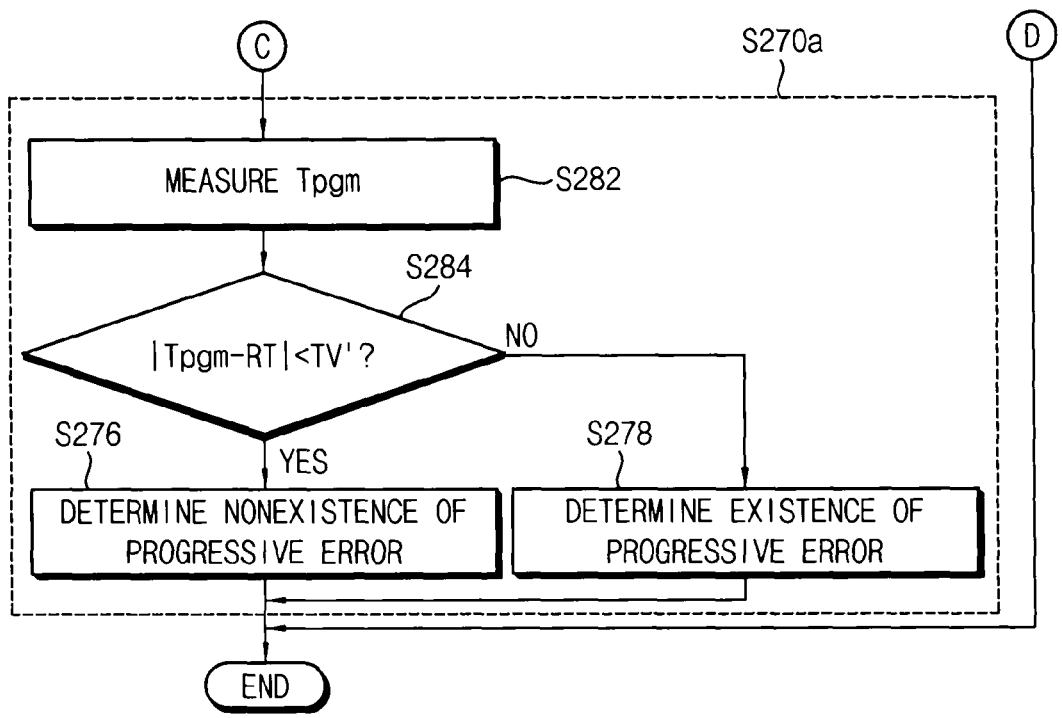
FIG. 7B is a flowchart illustrating a method of storing data in a nonvolatile memory device of FIG. 1, according to another embodiment of the inventive concept.

FIGS. 7A and 7B are flowcharts illustrating in detail a method of storing data in a nonvolatile memory device of FIG. 1.

Referring to FIGS. 7A and 7B, operations S205, S210, S230, S250, S252, S254 and S256 may be substantially the same as operations of S205, S210, S230, S250, S252, S254 and S256 of FIGS. 4A and 4B, respectively.

Where it is determined that the target memory cells are in the program pass state and the second verify operation is performed in operation S270a, the program lapse time Tpgm may be measured in operation S282. As shown in FIG. 5, the program lapse time Tpgm may be from a time where the program operation is initiated to a time where the target memory cells are in the program pass state. It may be determined by comparing the program lapse time Tpgm with reference time RT whether the progressive error occurs in the target memory cells. For example, where the difference between the program lapse time Tpgm and reference time RT is less than target value TV (S284=YES), it is determined that the progressive error does not occur in the target memory cells so that the storing of data may be successfully completed. Where the difference between the program lapse time Tpgm and reference time RT is greater than target value TV (S284=NO), it may be determined in operation S278 that the progressive error occurs in the target memory cells. As described below with reference to FIGS. 12A and 12B, even though it is determined that the target memory cells, which are determined as the occurrence of the progressive error is possible therein, are in the program pass state, the target memory cells may be replaced with any other memory cells of the memory cells.

Figure 8:
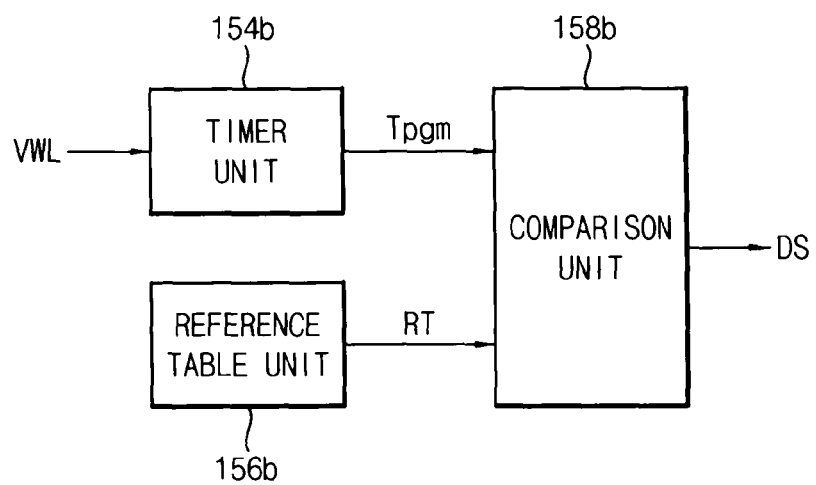
FIG. 8 is a block diagram of the determination unit in the nonvolatile memory device of FIG. 2, according to another embodiment of the inventive concept.

FIG. 8 is a block diagram of a determination unit in the nonvolatile memory device of FIG. 2, according to another embodiment of the inventive concept.

Referring to FIGS. 2 and 8, a determination unit 152b comprises a timer unit 154b, a reference table unit 156b and a comparison unit 158b.

Timer unit 154b measures program lapse time Tpgm. For example, timer unit 154b may measure the program lapse time Tpgm based on word line voltage VWL of the target memory cells. According to an embodiment of the inventive concept, timer unit 154b may measure the program lapse time Tpgm based on the write enable signal/WE.

Reference table unit 156b may be an arbitrary storage device and reference time RT may be stored in a form of a loop-up table.

According to some embodiments, reference time RT corresponds to an average program lapse time for the first memory block including the target memory cells. For example, where nonvolatile memory device 100 is a NAND flash memory device, the target memory cells may be in at least one page (111b of FIG. 3B), and reference time RT may correspond to the average program lapse time of all of the pages in a block (112b of FIG. 3B). According to some embodiments, reference time RT may correspond to an arbitrary value predetermined according to a threshold voltage distribution of the memory cells.

Comparison unit 158b compares program lapse time Tpgm with reference time RT in order to determine whether occurrence of a progressive error is possible in the target memory cells. For example, comparison unit 158b may compare the difference between program lapse time Tpgm and reference time RT with target value TV' to generate a detection signal DS corresponding to the determination result.

As described above, some or all of timer unit 154b, reference table unit 156b and comparison unit 158b may be implemented in hardware or software.

Figure 9:
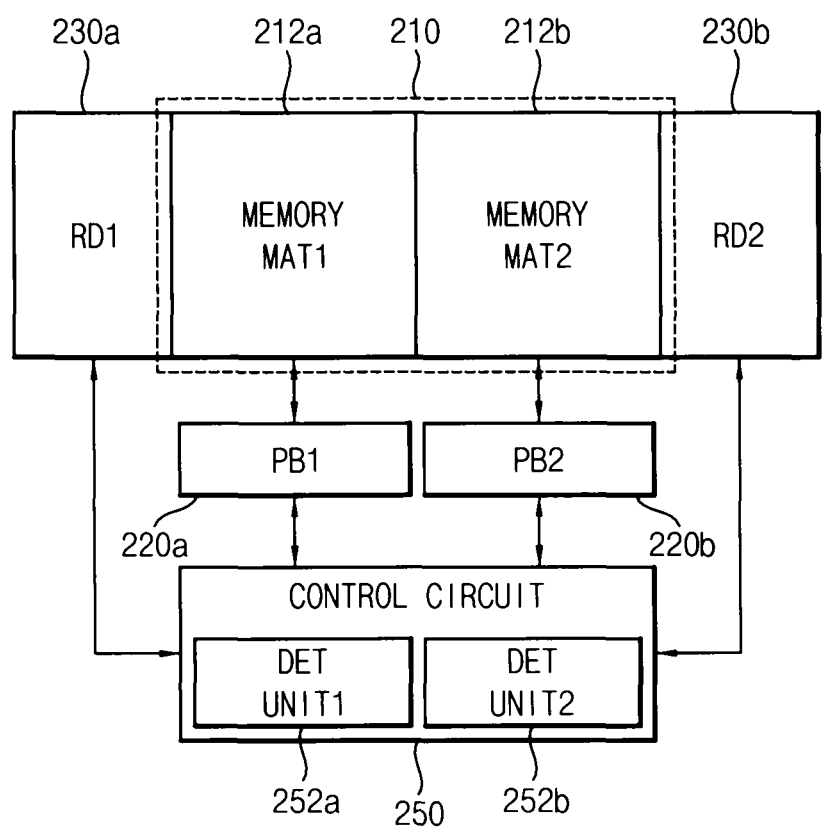
FIG. 9 is a block diagram of a nonvolatile memory device configured to perform a data storing method, according to an embodiment of the inventive concept.

FIG. 9 is a block diagram of a nonvolatile memory device configured to perform a data storing method according to an embodiment of the inventive concept. In the example of FIG. 9, the nonvolatile memory device may comprise a flash memory device, for example.

Referring to FIG. 9, nonvolatile memory device 200 comprises a memory cell array 210, page buffer units 220a and 220b, row decoders 230a and 230b, and a control circuit 250. Nonvolatile memory device 200 may further include a voltage generator (not shown) which is omitted for the purpose of convenient depiction.

Memory cell array 210 comprises multiple memory cells connected to multiple word lines and multiple bit lines, respectively. Memory cell array 210 comprises multiple memory mats 212a and 212b. First memory mat 212a comprises some of the memory cells and second memory mat 212b comprises the other memory cells.

Page buffer units 220a and 220b may be operated as write drivers or sensing amplifiers according to an operation mode of flash memory device 200. Row decoders 230a and 230b may select at least one of the word lines in response to a row address. First page buffer unit 220a and first row decoder 230a may be used for driving first memory mat 212a, and second page buffer unit 220b and second row decoder 230b may be used for driving second memory mat 212b. Control circuit 250 controls page buffer units 220a and 220b and row decoders 230a and 230b.

Memory mats 212a and 212b may be driven simultaneously and continuously in order to perform the data storing, erasing and read operations. Where flash memory device 200 is a NAND flash memory device and performs the data storing operation, data may be subsequently stored in the first and second memory mats 212a and 212b. For example, data may be subsequently stored in the first page in first memory mat 212a, the second page in second memory mat 212b and adjacent to the first page, the third page in first memory mat 212a and adjacent to the first page and the fourth page in second memory mat 212b and adjacent to the second and third pages. Further, because the first and second memory mats 212a and 212b are simultaneously driven, data are simultaneously stored in the first and second pages and data are simultaneously stored in the third and fourth pages. Thus, the data storing, erasing and read speeds of flash memory device 200 may be improved.

Control circuit 250 comprises determination units 252a and 252b. Determination units 252a and 252b perform the second verify operation for whether the program error symptom exists in the target memory cells. First determination unit 252a performs the second verify operation for first memory mat 212a, and second determination unit 252b performs the second verify operation for second memory mat 212b. As described above with reference to FIG. 2, all or part of each of determination units 252a and 252b may be implemented in hardware or software, and determination units 252a and 252b may be disposed at an arbitrary position of an inside or outside of flash memory device 200.

Although nonvolatile memory device 200 including two memory mats 212a and 212b and two determination units 252a and 252b corresponding to the two memory mats is depicted in FIG. 9, the nonvolatile memory device may include multiple memory mats and multiple determination units corresponding to the memory mats according to some embodiments.

Meanwhile, according to an embodiment of the inventive concept, the determination unit, which performs the second verify operation, may be employed in every block (for example, 112b of FIG. 3B) and mat (for example, 212a and 212b of FIG. 9) of the nonvolatile memory device and, in every memory chip including multiple nonvolatile memory devices.

Figure 10:
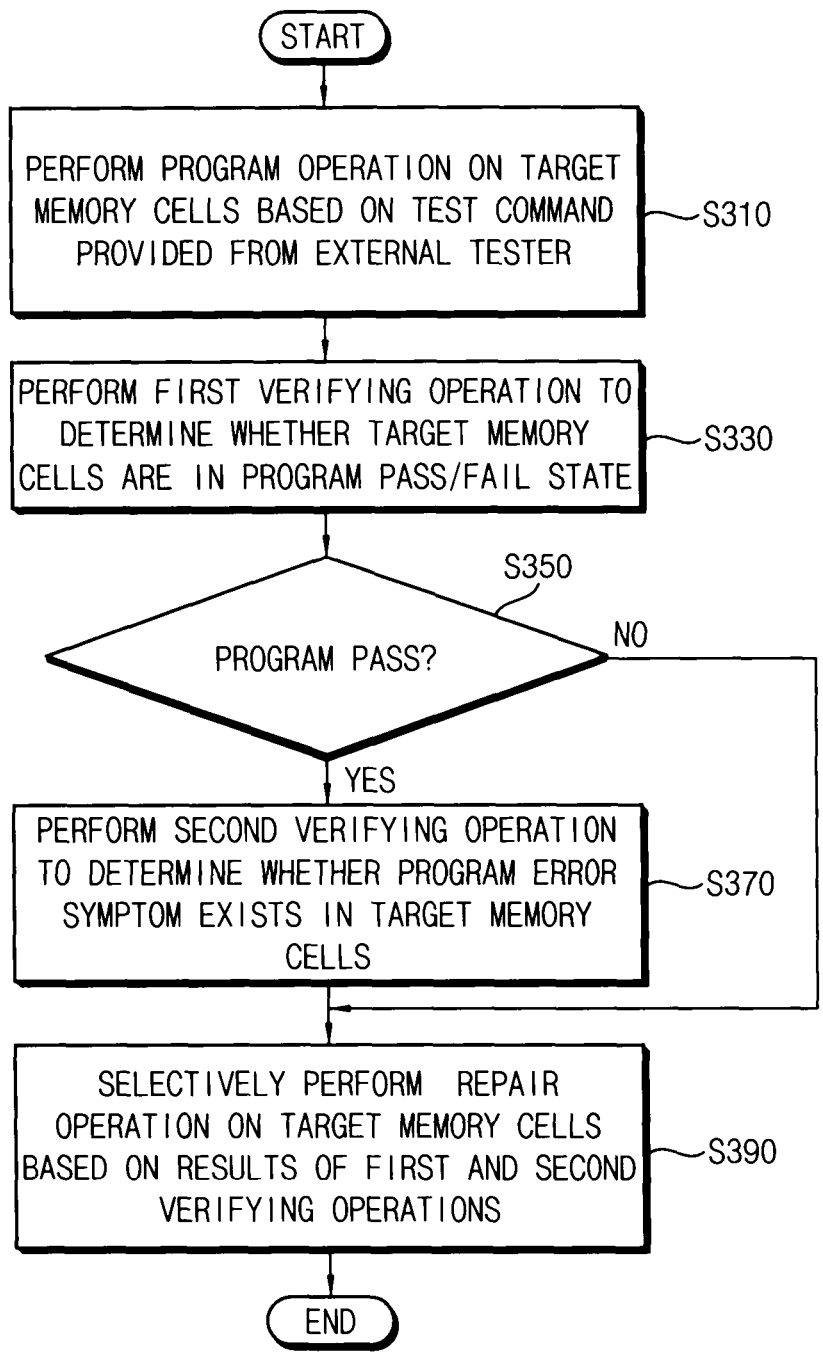
FIG. 10 is a flowchart illustrating a method of testing a nonvolatile memory device, according to an embodiment of the inventive concept.

FIG. 10 is a flowchart illustrating a method of testing a nonvolatile memory device, according to an embodiment of the inventive concept.

Referring to FIG. 10, a program operation for the target memory cells among the memory cells is performed based on the test command provided from an external tester (S310). Thereafter, the first verify operation is performed to verify whether the target memory cells are in a pass state or a program fail state (S330). The second verify operation for whether a program error symptom of the target memory cells exists is selectively performed based on the result of the first verify operation. In detail, where it is determined based on the result of the first verify operation that the target memory cells are in the program pass state (S350=YES), the second verify operation is performed (S370). Where it is determined based on the result of the first verify operation that the target memory cells are in the program fail state (S350=NO), the second verify operation is not performed. Operations S310, S330, S350 and S370 in FIG. 10 may be substantially the same as operations S110, S130, S150 and S170 of FIG. 1, respectively.

The repair operation is selectively performed for the target memory cells based on the results of the first and second verify operations (S390). For example, where it is determined based on the result of the first verify operation that the target memory cells are in the program fail state or it is determined based on the result of the second verify operation that the program error symptom exists in the target memory cells, the repair operation may be performed.

In a method of storing data for a nonvolatile memory device according to an embodiment of the inventive concept, the second verify operation is further performed based on a verifying result of a first verify operation to determine whether a program error symptom exists in target memory cells which are determined as a program pass state, and the repair operation is performed with respect to the target memory cells, which are determined as to have a program fail state or a program error symptom. Thus, it is possible to effectively prevent an uncorrectable error from occurring in the target memory cells, which are determined as a program pass state, due to the progressive error, and the performance of the non-volatile memory device may be improved.

Figure 11:
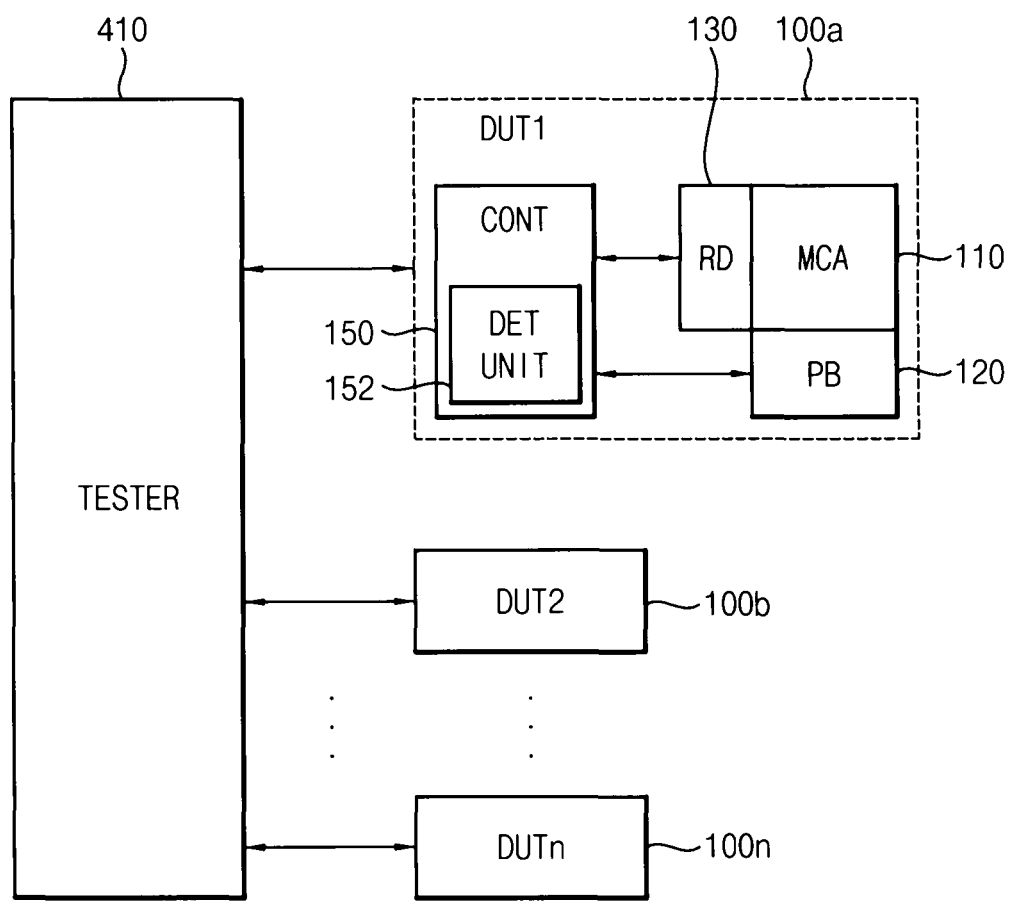
FIG. 11 is a block diagram of a test system configured to perform a test method, according to an embodiment of the inventive concept.

FIG. 11 is a block diagram of a test system configured to perform a test method, according to an embodiment of the inventive concept.

Referring to FIG. 11, a test system 400 comprises a tester 410 and multiple DUTs 100a, 100b, . . . , 100n.

Tester 410 tests in parallel devices under test (DUTs) 100a, 100b, . . . , 100n. For example, tester 410 may provide a test command and test data to each of DUTs 100a, 100b, . . . , 100n. The test data may be stored in each of DUTs 100a, 100b, . . . , 100n. Tester 410 reads out the test data stored in each of DUTs 100a, 100b, . . . , 100n and may compare the read data and the test data with each other to test DUTs 100a, 100b, . . . , 100n. Where at least one defective memory cell is detected from DUTs 100a, 100b, . . . , 100n, tester 410 may provide a repair command to the DUT from which the defective memory cell is detected. The DUT from which the defective memory cell is detected may perform the repair operation based on the repair command, so that the defective memory cell may be replaced with a redundant memory cell. Each of DUTs 100a, 100b, . . . , 100n may be a nonvolatile memory device as illustrated in FIG. 2.

Figure 12A:
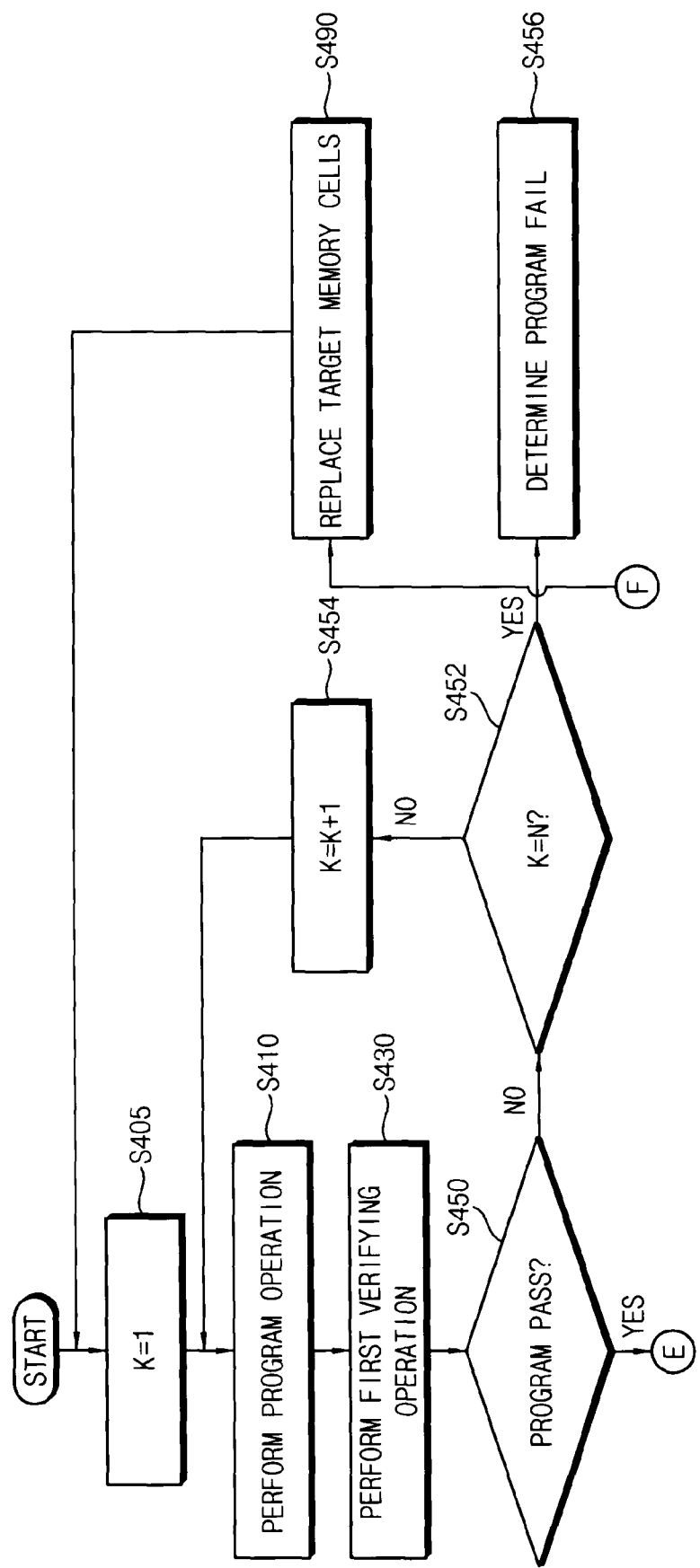
FIGS. 12A and 12B are flowcharts illustrating a method of testing the nonvolatile memory device of FIG. 10, according to an embodiment of the inventive concept.
Figure 12B:
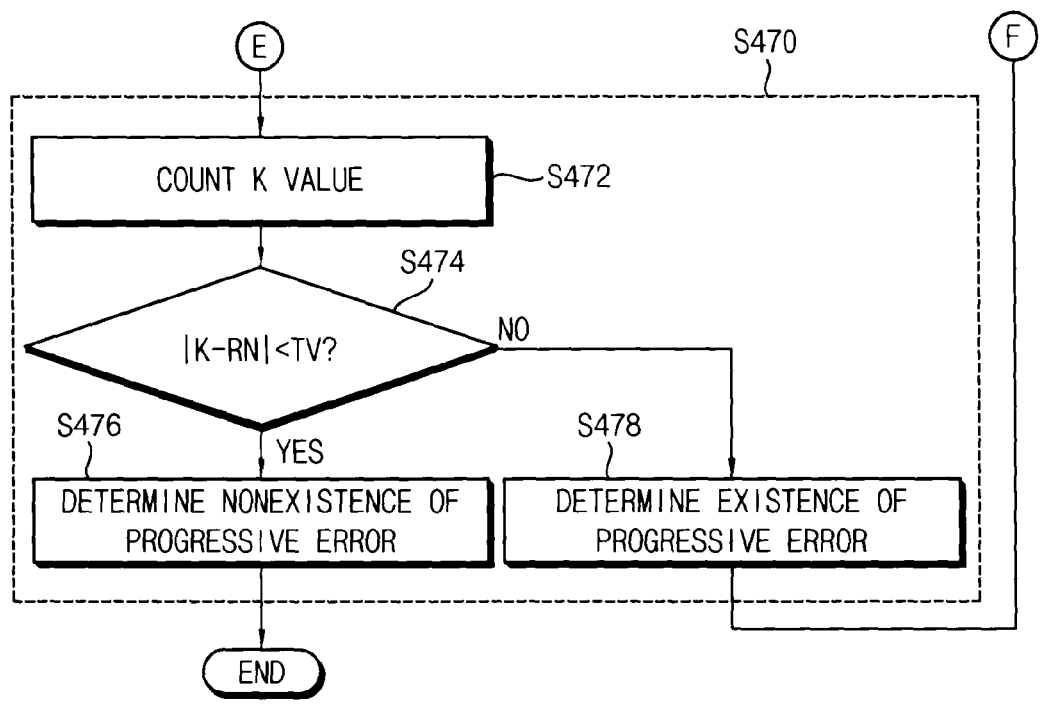

FIGS. 12A and 12B are flowcharts illustrating a method of testing the nonvolatile memory device of FIG. 10, according to an embodiment of the inventive concept.

Referring to FIGS. 12A and 12B, operations S405, S410, S430, S450, S452, S454, S456, S470, S472, S474, S476 and S478 may be substantially the same as operations S205, S210, S230, S250, S252, S254, S256, S270, S272, S274, S276 and S278 of FIGS. 4A and 4B, respectively.

Where it is finally determined based on the result of the first verify operation in operation S456 that the target memory cells are in the program fail state or it is determined based on the result of the second verify operation in operation S478 that occurrence of the progressive error is possible in the target memory cells, the target memory cells may be replaced with any other memory cells of the memory cells in operation S490. The program operation, the first verify operation and the second verify operation may be performed for the replaced target memory cells.

Even though certain embodiments (See, e.g., FIGS. 7A and 7B) perform the second verify operation based on the program lapse time Tpgm, this operation may be performed based on alternative criteria. Moreover, although certain embodiments are described around a data storing method, the described concepts may be applied to a method of erasing data. Hereinafter, certain embodiments will be described around a method of erasing data.

Figure 13:
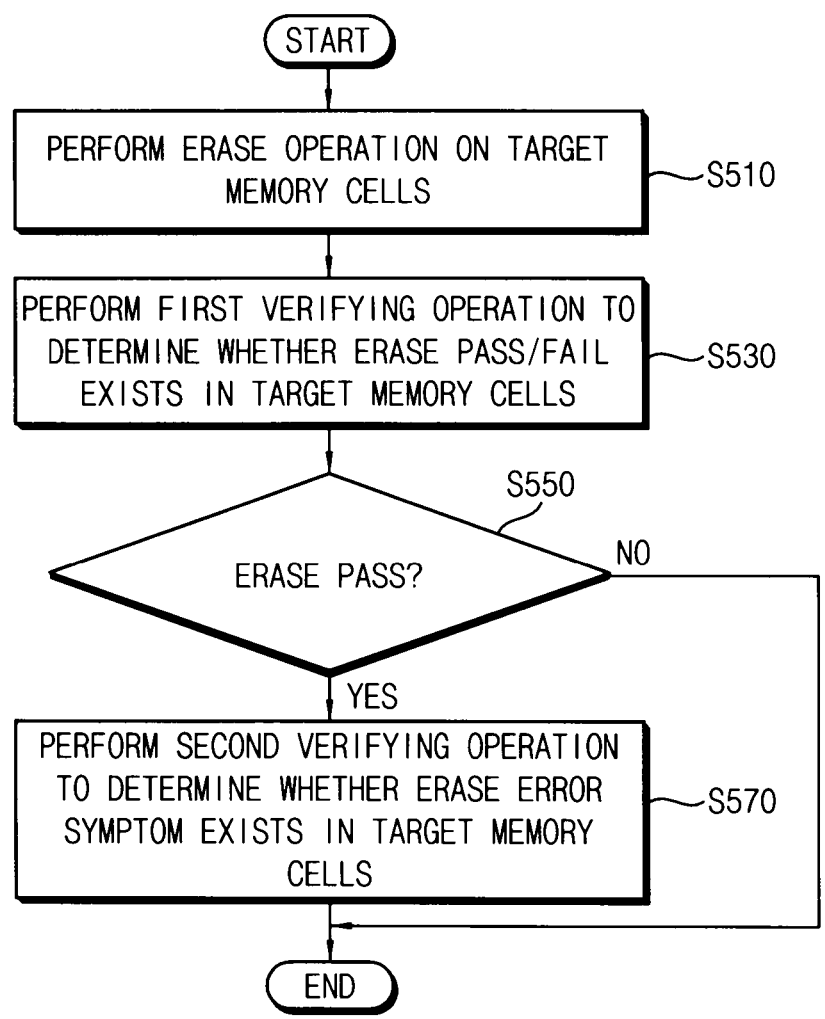
FIG. 13 is flowchart illustrating a method of erasing data from a nonvolatile memory device, according to an embodiment of the inventive concept.

FIG. 13 is flowchart illustrating a method of erasing data from a nonvolatile memory device, according to an embodiment of the inventive concept.

Referring to FIG. 13, an erasing operation is performed for target memory cells of the memory cells (S510). The first verify operation for whether the target memory cells are in an erasing pass or an erasing fail is performed (S530). For example, in a flash memory device, the erasing of the target memory cells may be performed by applying an erase voltage to the word line of the target memory cells. In addition, it may be verified whether the target memory cells are in erase pass/fail by applying a verification voltage to the word line of the target memory cells and by comparing a threshold voltage of the target memory cells with the verification voltage.

The second verify operation for whether an erase error symptom exists in the target memory cells is selectively performed based on the result of the first verify operation. In particular, where it is determined based on the result of the first verify operation that the target memory cells are in the erase pass state (S550=YES), the second verify operation is performed (S570). Where it is determined based on the result of the second verify operation that the erase error symptom does not exist in the target memory cells, the erasing of data from the target memory cells may be successfully completed. Where it is determined based on the result of the second verify operation that the erase error symptom exists in the target memory cells, even though it is determined based on the result of the first verify operation that the target memory cells are in the erase pass state, the easing of data from the target memory cells may not be successfully completed.

Where it is determined based on the result of the first verify operation that the target memory cells are in the erase fail state (S550=NO), the second verify operation is not performed and the easing of data from the target memory cells may not be successfully completed.

Like the embodiments of FIGS. 4A, 4B, 7A and 7B, although not depicted, the method of erasing data from a nonvolatile memory device of FIG. 13 may be performed as follows. The number of erase loops is reset, the erase operation for the target memory cells and the first verify operation are performed, an erase loop is selectively repeated based on the result of the first verify operation, and then, where it is determined that the target memory cells are in the erase pass state, it is determined whether occurrence of the progressive error is possible in the target memory cells based on the number of erase loops and the erase lapse time. In a case of a NAND flash memory device, because the target memory cells may be in at least one block (112b of FIG. 3B), the number of erase loops or the erase lapse time may correspond to an average value of the number of erase loops or the erase lapse time of all blocks in the memory cell array including the block (112b of FIG. 3B).

Figure 14:
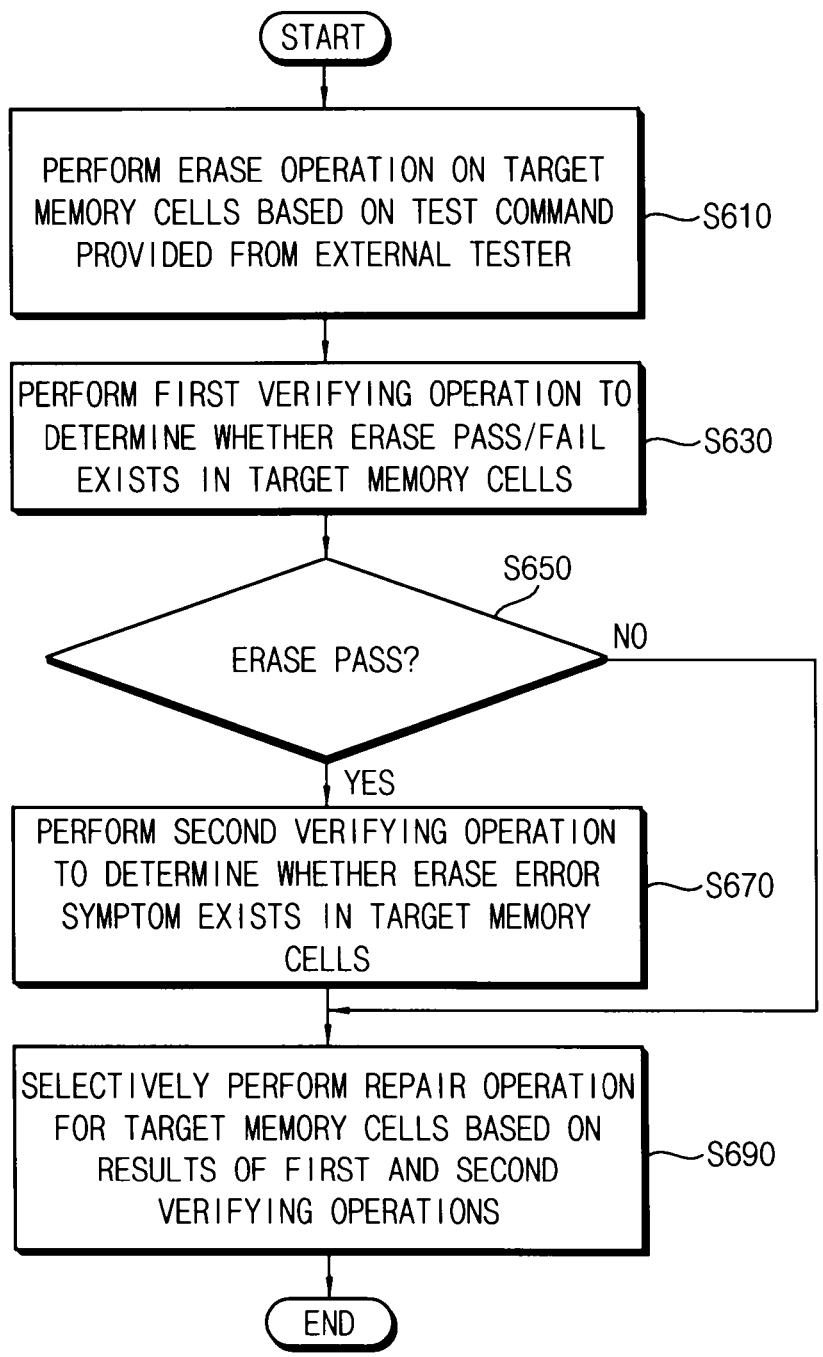
FIG. 14 is a flowchart illustrating a method of testing a nonvolatile memory device, according to an embodiment of the inventive concept.

FIG. 14 is a flowchart illustrating a method of testing a nonvolatile memory device, according to an embodiment of the inventive concept.

Referring to FIG. 14, an erasing operation is performed for the target memory cells of the memory cells based on the test command provided from an external tester (S610). The first verify operation for whether the target memory cells are in an erasing pass or an erasing fail is performed (S630). The second verify operation for whether an erase error symptom exists in the target memory cells is selectively performed based on the result of the first verify operation. In detail, where it is determined based on the result of the first verify operation that the target memory cells are in the erase pass state (S650=YES), the second verify operation is performed (S670). Where it is determined based on the result of the first verify operation that the target memory cells are in the erase fail state (S650=NO), the second verify operation is not performed. In the method of FIG. 14, operations S610, S630, S650 and S670 may be substantially the same as operations S510, S530, S550 and S570 of FIG. 13, respectively.

The repair operation for the target memory cells is selectively performed based on the results of the first and second verify operations (S690). For example, where it is determined based on the result of the first verify operation that the target memory cells are in the program fail state or it is determined based on the result of the second verify operation that the program error symptom exists in the target memory cells, the repair operation may be performed.

Like the embodiments of FIGS. 12A and 12B, although not depicted, the method of testing a nonvolatile memory device of FIG. 14 may be performed as follows. The number of erase loops is reset, the erase operation for the target memory cells and the first verify operation are performed, and the ease loop is selectively repeated based on the result of the first verify operation. Then, it is determined whether occurrence of the progressive error is possible in the target memory cells based on the number of erase loops and the erase lapse time where it is determined that the target memory cells are in the erase pass state, and then, where it is finally determined that the target memory cells are in the erase fail state or it is determined that occurrence of the progressive error is possible in the target memory cells, the target memory cells may be replaced with any other memory.

Figure 15:
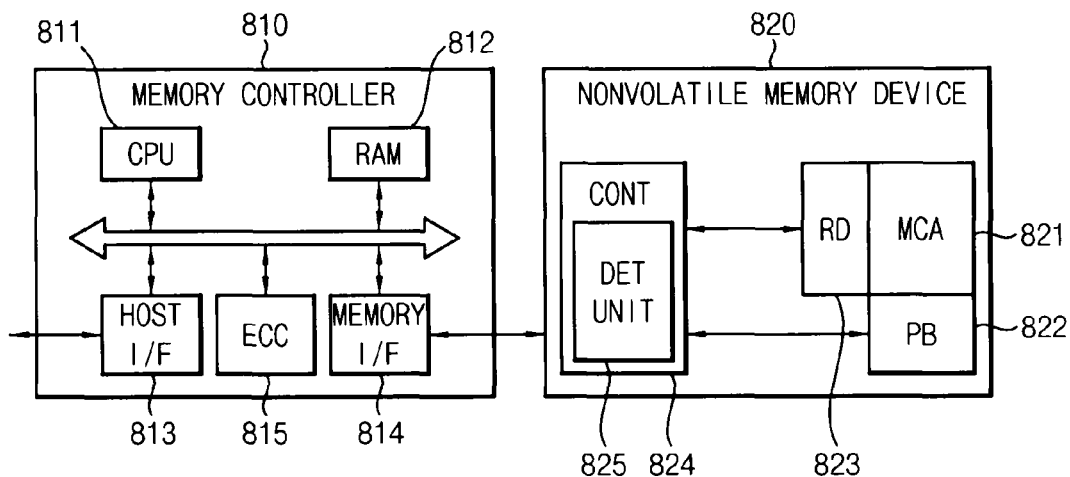
FIG. 15 is a block diagram of a memory system, according to an embodiment of the inventive concept.

FIG. 15 is a block diagram of a memory system, according to an embodiment of the inventive concept.

Referring to FIG. 15, memory system 800 comprises a memory controller 810 and a nonvolatile memory device 820.

Nonvolatile memory device 820 comprises a memory cell array 821, a page buffer unit 822, a row decoder 823, and a control circuit 824. Memory cell array 821 comprises multiple memory cells, page buffer unit 822 may be operated as a write driver or a sensing amplifier according to an operation mode, and row decoder 823 may select a word line in response to a row address. Control circuit 824 controls page buffer unit 822 and row decoder 823, and may comprise a determination unit 825 which performs the second verify operation for whether a program/erase error symptom exists in the target memory cells of the memory cells.

Nonvolatile memory device 820 may further perform the second verify operation for verifying whether the program/erase error symptom exists in the target memory cells which is determined as the program/erase pass state based on the result of the first verify operation, and may perform the repair operation for the target memory cells which are determined as the program/erase error symptom or the existence of the program/erase error symptom, so that nonvolatile memory device 820 may effectively prevent from being generated an error which is uncorrectable due to the generation of a progressive badness in the target memory cells determined as the state of a program/erase pass and the performance of nonvolatile memory device 820 may be improved.

Memory controller 810 controls nonvolatile memory device 820. Memory controller 810 controls a data exchange between an external host (not shown) and nonvolatile memory device 820. Memory controller 810 may include a CPU (Central Processing Unit) 811, a buffer memory 812, a host interface 813, and a memory interface 814. CPU 811 may perform an operation for the data exchange. Buffer memory 812 comprises a dynamic random access memory (DRAM), static random access memory (SRAM), PRAM, FRAM, RRAM, or MRAM. According to an embodiment of the inventive concept, buffer memory 812 may be placed at an inside or outside of controller 810.

Host interface 813 is connected to host and memory interface 814 is connected to nonvolatile memory device 820. CPU 811 communicates with the host through host interface 813. For example, host interface 813 may be configured to communicate with the host through at least one among various interface protocols such as Universal Serial Bus (USB), Multi-Media Card (MMC), Peripheral Component Interconnect-Express (PCI-E), Serial-attached SCSI (SAS), Serial Advanced Technology Attachment (SATA), Parallel Advanced Technology Attachment (PATA), Small Computer System Interface (SCSI), Enhanced Small Disk Interface (ESDI), or Integrated Drive Electronics (IDE). Further, CPU 811 may communicate with memory device 820 through memory interface 814. According to an embodiment of the inventive concept, memory controller 810 may further comprise an error correction block 815 for correcting an error. According to some embodiments of the inventive concept, memory controller 810 comprises a built-in memory device 820 or memory controller 810 and nonvolatile memory device 820 may be implemented as mutually separated chips.

Memory system 800 may be implemented in such a form as a memory card or a solid state drive. nonvolatile memory device 820, memory controller 810 and/or memory system 800 may be implemented in various packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 16:
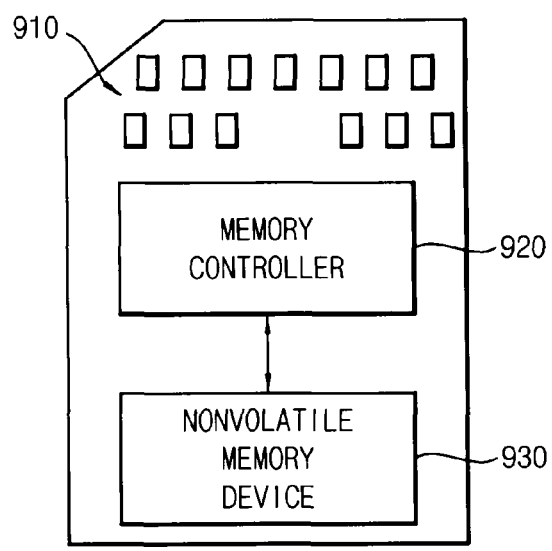
FIG. 16 is a diagram of a memory card comprising a memory system, according to an embodiment of the inventive concept.

FIG. 16 is a diagram of a memory card comprising a memory system according to an embodiment of the inventive concept.

Referring to FIG. 16, a memory card 900 comprises multiple connecting pins 910, a memory controller 920 and a nonvolatile memory device 930.

Connecting pins 910 are connected to a host (not shown) such that signals are transceived between the host and memory card 900. Connecting pin 910 comprises a clock pin, a command pin, data pin and/or a reset pin.

Memory controller 920 receives data from the host and stores the received data in nonvolatile memory device 930. Nonvolatile memory device 930 further performs the second verify operation for verifying whether the program/erase error symptom exists in the target memory cells which is determined as the program/erase pass state based on the result of the first verify operation, and may perform the repair operation for the target memory cells which are determined as the program/erase error symptom or the existence of the program/erase error symptom, so that nonvolatile memory device 930 may effectively prevent from being generated an error which is uncorrectable due to the generation of a progressive badness in the target memory cells determined as the program/erase pass state and the performance of nonvolatile memory device 930 may be improved.

Memory card 900 may be, for instance, a memory card such as a an Multi-Media Card (MMC), an embedded Multi- Media Card (eMMC), a hybrid eMMC, a Secure Digital (SD) card, a micro-SD card, a memory stick, an ID card, a Personal Computer Memory Card International Association (PCM-CIA) card, a chip card, an USB card, a smart card, or a Compact Flash (CF) Card.

According to some embodiments of the inventive concept, memory card 900 may be installed into a host such as a computer, a laptop computer, a cellular phone, a smart phone, an MP3 player, a Personal Digital Assistants (PDA), a Portable Multimedia Player (PMP), a digital TV, a digital camera, or a portable game console.

Figure 17:
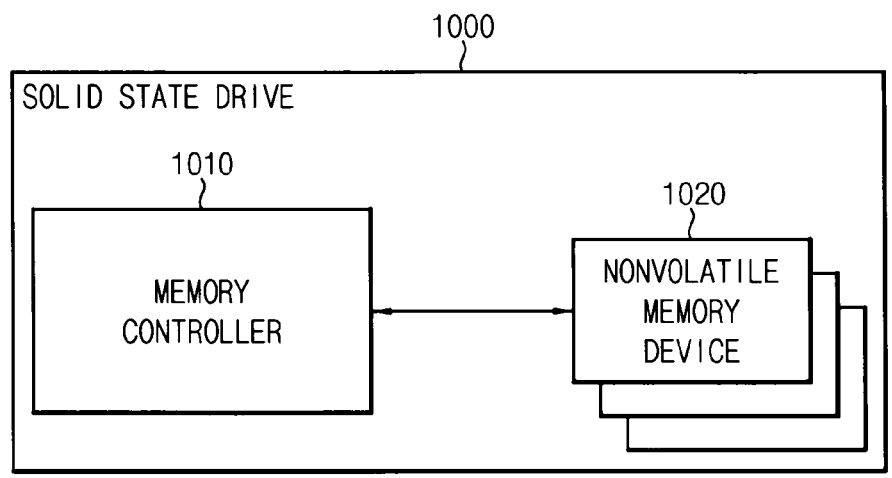
FIG. 17 is a diagram of a solid state drive (SSD) comprising a memory system, according to an embodiment of the inventive concept.

FIG. 17 is a diagram of an SSD 1000 comprising a memory system, according to an embodiment of the inventive concept.

Referring to FIG. 17, SSD 1000 comprises a memory controller 1010 and multiple nonvolatile memory devices 1020.

Memory controller 1010 receives data from the host (not shown) and stores the received data in nonvolatile memory device 1020. Each of the nonvolatile memory devices 1020 further performs the second verify operation for verifying whether the program/erase error symptom exists in the target memory cells which is determined as the program/erase pass state based on the result of the first verify operation. Each of these devices also performs the repair operation for the target memory cells which are determined as the state of the program/erase error symptom or the existence of the program/erase error symptom. Accordingly, these devices may effectively prevent uncorrectable errors due to the generation of a progressive errors in the target memory cells determined as the program/erase pass state and the performance of nonvolatile memory device 1020 may be improved.

According to an embodiment of the inventive concept, SSD 1000 may be installed into a host such as a computer, a laptop computer, a cellular phone, a smart phone, an MP3 player, a Personal Digital Assistants (PDA), a Portable Multimedia Player (PMP), a digital TV, a digital camera, or a portable game console.

Figure 18:
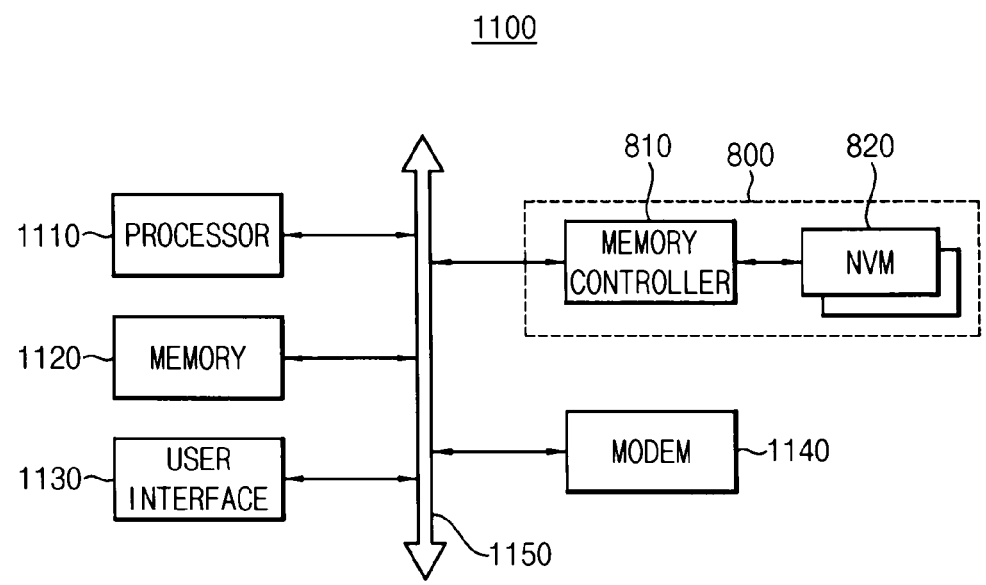
FIG. 18 is a block diagram of a computing system, according to an embodiment of the inventive concept.

FIG. 18 is a block diagram of a computing system, according to an embodiment of the inventive concept.

Referring to FIG. 18, computing system 1100 comprises a processor 1110, a memory device 1120, a user interface 1130, and a memory system 8000. In some embodiments, computing system 1100 further comprises a modem 1140 such as a baseband chipset.

Processor 1110 executes a specific calculation or tasks. For example, processor 1110 may be a processor or a CPU. Processor 1110 may be connected to memory device 1120 through a bus 1150 such as an address bus, a control bus or a data bus. For example, memory device 1120 may be implemented with DRAM, mobile DRAM, SRAM, PRAM, FRAM, RRAM or MRAM. Further, processor 1110 may be connected to an expansion bus such as a PCI. Thus, processor 1110 may control user interface 1130 including at least one input device such as a keyboard or a mouse, and at least one output device such as a printer or a display. Modem 1140 may wirelessly transceive data with an external apparatus. Memory device 820 may store the data processed by processor 1110 or the data received through modem 1140 through memory controller 810 therein. Computing system 1100 may further comprise a power supply for supplying an operation voltage. Further, according to an embodiment of the inventive concept, computing system 1100 may further include an application chipset, and a camera image processor (CIS).

Embodiments may be applied to, e.g., a nonvolatile memory device such as a flash memory, and various apparatuses and systems including the nonvolatile memory device. As examples, embodiments may be expansively applied to a memory card, a solid state drive, a computer, a laptop computer, a cellular phone, a smart phone, an MP3 player, a PDA, a PMP, a digital TV, a digital camera, and a portable game console.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of storing data in a nonvolatile memory device, comprising:
   performing a program operation on target memory cells among multiple memory cells;
   performing a first verify operation to determine whether the target memory cells are in a program pass state or a program fail state; and
   as a consequence of determining that the target memory cells are in the program pass state, performing a second verify operation to determine whether the target memory cells exhibit a program error symptom,
   wherein performing the second verify operation comprises:
   counting a number of program loops used to place the target memory cells in the program pass state; and
   determining whether the target memory cells exhibit a progressive error by comparing the number of the program loops with a reference number.

2. The method of claim 1, further comprising:
   determining that the target memory cells do not exhibit the progressive error where a difference between the number of the program loops and the reference number is less than a target value, and
   determining that the target memory cells do exhibit the progressive error where the difference between the number of the program loops and the reference number is greater than or equal to the target value.

3. The method of claim 2, further comprising substituting other memory cells among the memory cells for the target memory cells where it is determined the target memory cells exhibit the progressive error.

4. The method of claim 1, wherein the reference number corresponds to an average number of program loops required to achieve the program pass state when programming memory cells in a first memory block including the target memory cells.

5. The method of claim 1, wherein the nonvolatile memory device comprises a determination unit configured to perform the second verify operation, the determination unit comprising:
   a counter unit configured to count the number of the program loops;
   a reference table unit configured to store the reference number; and
   a comparison unit configured to compare the number of the program loops with the reference number to determine whether the target memory cells exhibit the progressive error.

6. A method of storing data in a nonvolatile memory device, comprising:
performing a program operation on target memory cells among multiple memory cells;
performing a first verify operation to determine whether the target memory cells are in a program pass state or a program fail state; and
as a consequence of determining that the target memory cells are in the program pass state, performing a second verify operation to determine whether the target memory cells exhibit a program error symptom,
wherein performing the second verify operation comprises:
measuring an interval from a time where the program operation is initiated to a time where the target memory cells are determined to have achieved the program pass state; and
determining whether the target memory cells exhibit a progressive error by comparing the interval with the reference time.

7. The method of claim 6, further comprising:
determining that the target memory cells do not exhibit a progressive error where a difference between the interval and the reference time is less than a target value, and
determining that the target memory cells do exhibit the progressive error where the difference between the interval and the reference time is greater than or equal to the target value.

8. The method of claim 6, wherein the nonvolatile memory device further comprises a determination unit configured to perform the second verify operation, and the determination unit comprises:
a timer unit configured to measure the interval;
a reference table unit configured to store the reference time; and
a comparison unit configured to compare the interval with the reference time to determine whether the target memory cells exhibit the progressive error.

9. The method of claim 1, wherein the program operation and the first verify operation are repeatedly performed where it is determined by the first verify operation that the target memory cells are in the program fail state, and
the target memory cells are replaced with other memory cells among the memory cells where it is determined that the target memory cells are in the program fail state even after the program operation and the first verify operation are repeated by a maximum number of times.

10. The method of claim 1, wherein the nonvolatile memory device comprises:
multiple memory mats each comprising a part of the memory cells;
multiple determination units corresponding to the multiple memory mats, respectively, and configured to perform the second verify operation for each of the memory mats.

11. The method of claim 1, wherein the nonvolatile memory device comprises a vertical memory device in which multiple word lines are vertically laminated.

12. The method of claim 1, wherein each of the memory cells comprises a single level memory cell in which one data bit is stored or a multi-level memory cell in which multiple data bits are stored.

13. A method of testing a nonvolatile memory device, comprising:
performing a program operation on target memory cells among multiple memory cells based on a test command provided from an external tester;
performing a first verify operation to determine whether the target memory cells are in a program pass state or a program fail state;
as a consequence of the first verify operation determining that the target memory cells are in the program pass state, performing a second verify operation to determine whether the target memory cells exhibit a program error symptom; and
selectively performing a repair operation on the target memory cells according to results of the first and second verify operation s
wherein performing the second verify operation comprises:
counting a number of program loops used to place the target memory cells in the program pass state; and
determining whether the target memory cells exhibit a progressive error by comparing the number of the program loops with a reference number.

14. The method of claim 13, wherein selectively performing the repair operation comprises:
replacing the target memory cells with other memory cells as a consequence of the first verify operation determining that the target memory cells are in the program fail state; and
replacing the target memory cells with the other memory cells as a consequence of the second verify operation determining that the target memory cells exhibit the program error symptom.

15. The method of claim 13, further comprising:
determining that the target memory cells do not exhibit the progressive error where a difference between the number of the program loops and the reference number is less than a target value, and
determining that the target memory cells do exhibit the progressive error where the difference between the number of the program loops and the reference number is greater than or equal to the target value.

16. The method of claim 13, wherein the nonvolatile memory device comprises a determination unit configured to perform the second verify operation, the determination unit comprising:
a counter unit configured to count the number of the program loops;
a reference table unit configured to store the reference number; and
a comparison unit configured to compare the number of the program loops with the reference number to determine whether the target memory cells exhibit the progressive error.

17. A method of testing a nonvolatile memory device, comprising:
performing a program operation on target memory cells among multiple memory cells based on a test command provided from an external tester;
performing a first verify operation to determine whether the target memory cells are in a program pass state or a program fail state;
as a consequence of the first verify operation determining that the target memory cells are in the program pass state, performing a second verify operation to determine whether the target memory cells exhibit a program error symptom; and
selectively performing a repair operation on the target memory cells according to results of the first and second verify operations,
wherein performing the second verify operation comprises:

measuring an interval from a time where the program operation is initiated to a time where the target memory cells are determined to have achieved the program pass state; and determining whether the target memory cells exhibit a progressive error by comparing the interval with the reference time.

18. The method of claim 17, further comprising:

determining that the target memory cells do not exhibit a progressive error where a difference between the interval and the reference time is less than a target value, and determining that the target memory cells do exhibit the progressive error where the difference between the interval and the reference time is greater than or equal to the target value.

* * * * *